US006831489B2

(12) United States Patent
Cheung et al.

(10) Patent No.: US 6,831,489 B2
(45) Date of Patent: Dec. 14, 2004

(54) LOW-VOLTAGE HIGH-SPEED FREQUENCY-DIVIDER CIRCUIT

(75) Inventors: Sin-Luen Cheung, Tai Po (HK); Man-Chun Wong, New Territories (HK); Howard Cam Luong, Kowloon (HK)

(73) Assignee: The Hong Kong University of Science and Technology, Kowloon (HK)

( * ) Notice: Subject to any disclaimer, the term of this patent is extended or adjusted under 35 U.S.C. 154(b) by 0 days.

(21) Appl. No.: 10/442,168

(22) Filed: May 21, 2003

(65) Prior Publication Data

US 2004/0012416 A1 Jan. 22, 2004

Related U.S. Application Data

(60) Provisional application No. 60/381,783, filed on May 21, 2002.

(51) Int. Cl.[7] .................................................. H03K 21/00
(52) U.S. Cl. ...................................... 327/115; 377/47
(58) Field of Search ................................. 327/115, 117; 377/47, 48

(56) References Cited

U.S. PATENT DOCUMENTS

| 4,845,727 A | * | 7/1989 | Murray | 377/43 |
| 6,529,052 B2 | * | 3/2003 | Wang | 327/120 |
| 6,674,660 B2 | * | 1/2004 | Shau | 365/49 |

* cited by examiner

Primary Examiner—Linh M. Nguyen
(74) Attorney, Agent, or Firm—Burns, Doane, Swecker & Mathis, L.L.P.

(57) ABSTRACT

A frequency divider circuit is disclosed that generates output signals having a frequency substantially half of the frequency of the input signal. The circuit comprises two D-Flip-Flop circuits wherein one employs the said input signal and the other one employs the complement of the said input signal, and each of the two D-Flip-Flop circuits consists of a pair of loading transistors, two regenerative pairs coupled with each others, and two common-gate switches.

7 Claims, 3 Drawing Sheets

Proposed frequency divider

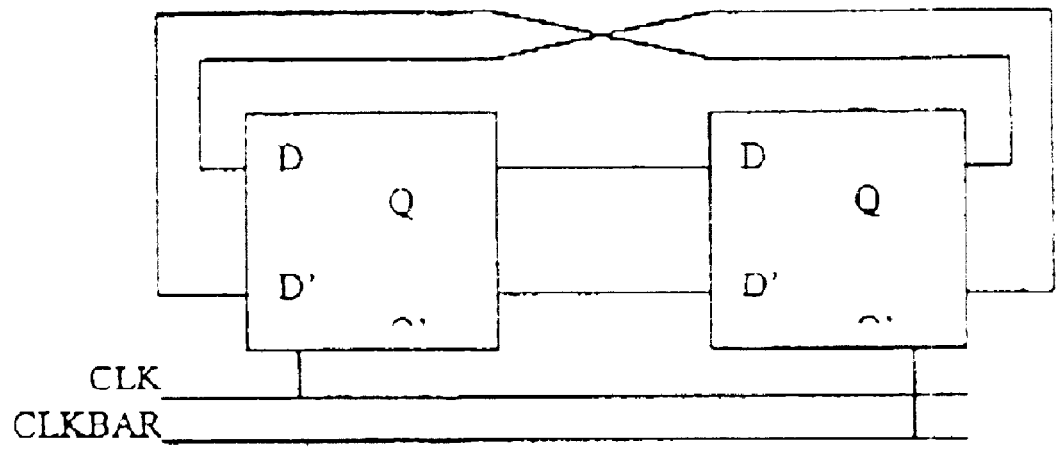
Fig. 3 Building Block of Proposed frequency divider
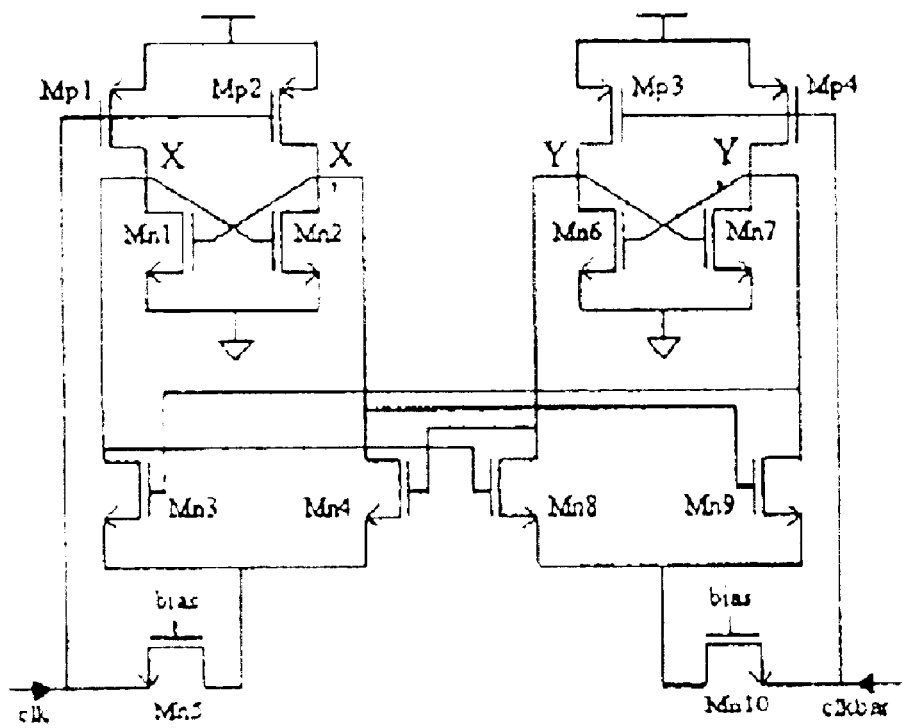
Fig. 4 Proposed frequency divider

LOW-VOLTAGE HIGH-SPEED FREQUENCY-DIVIDER CIRCUIT

This application claims benefit of provisional application 60/381,783 filed May 21, 2002.

FIELD OF THE INVENTION

This invention relates a CMOS frequency divide-by-2 analog circuit, and in particular to a frequency divider that is capable of operation at very low supply voltages and very high frequencies.

PRIOR ART

Previous designs of Source-Coupled-Logic-Based frequency dividers employ two D-flip-flops in master/slave configuration as shown in FIG. 1. The output signal of one of the D-flip-flops is fed back to the input of the other D-flip-flop, and vice versa. Each D-flip-flop is controlled by a pair of complementary clock signals (CLK and CLKBAR). The function of the frequency divider is to receive a CLK signal having a frequency as one of the input and to produce an output signal equal to substantially half of the CLK frequency.

A conventional high-speed frequency divider circuit is shown in FIG. 2. This circuit includes two identical D-flip-flop circuit sections. Each D-flip-flop needs a pair of complementary clock signals (CLK and CLKBAR) for proper operation. Each D-flip-flop includes a pair of PMOS transistors ($Mp_1$, $Mp_2$) for which their sources are connected to a DC voltage supply ($V_{dd}$). Clock signals are applied to these transistors' gate terminals to control their resistance. Two pairs of NMOS transistor ($Mn_1$, $Mn_2$) and ($Mn_4$, $Mn_5$) are connected to the output nodes of each D-flip-flop. The transistor pair ($Mn_1$, $Mn_2$) is connected to a NMOS switch ($Mn_6$), which is controlled to turn on and off by CLK signal. Another pair ($Mn_4$, $Mn_5$) is connected to a NMOS switch ($Mn_3$) which is driven by CLKBAR signal for turning on and off. This circuit is operated as a dynamic-loading frequency divider. In particular, when the CLK signal is high (CLKBAR is low), the switch ($Mn_6$) is turned on, and the ($Mp_1$, $Mp_2$) loading is operated in linear-region. In this case, NMOS pair ($Mn_4$, $Mn_5$) compares the amplitudes of the input signals from their input gate terminals and passes to the results to their output nodes. When the CLK signal is low (CLKBAR is high), the switches ($Mn_3$) and ($Mn_6$) are turned on and off respectively. The ($Mp_1$, $Mp_2$) loading is operated in the cutoff region. The NMOS pair ($Mn_1$, $Mn_2$) acts as positive feedback to latch the output node.

The main problem with such conventional designs is that the minimum required supply voltage ($V_{dd}$) is limited by the DC biasing requirements of the input gate terminals of the PMOS transistors ($Mp_1$, $Mp_2$) and the NMOS switches ($Mn_3$, $Mn_6$) at the same time.

In order to properly bias the PMOS transistors and the NMOS switches with low turn-on resistance, a minimum over-drive voltage ($V_{overdrive}=V_{GS}-V_T$) of 0.15V is usually required. As a result, the voltage supply for the conventional frequency divider ($V_{dd}$) has to be at least equal to $|V_{t(PMOS)}|+V_{t(NMOS)}+0.3V$. As an example, for a standard 0.35-mm CMOS process, $V_{t(PMOS)}=0.8V$, $V_{t(NMOS)}=0.6V$, the minimum supply voltage is equal to 1.7V.

As the supply voltage drops below 1 V, the frequency divider fails to function at high frequencies. Those familiar with the arts will readily understand the problem by considering a CMOS complementary inverter that operates at a 1-V supply. The inverter is only functional properly if it is driven by a rail-to-rail input clock signal. This is because the NMOS device can be turned on only with a clock signal ($V_{clk}$) "high" enough to overcome its threshold voltage ($V_{clk}>V_{tn}$) while the PMOS device can be turned on only with a clock signal ($V_{clk}$) "low" enough ($V_{clk}<Vdd-|V_{tp}|$). As a result, for a low supply voltage ($V_{dd}<V_{tn}+|V_{tp}|$), there would exist a dead-zone region ($V_{tn}>V_{clk}>V_{dd}-|V_{tp}|$) in which the inverter responds very slowly or even ceases to function. A similar problem occurs in the conventional frequency dividers at a low supply voltage.

SUMMARY OF THE INVENTION

In this invention, a frequency-divider circuit is proposed to operate at a very low voltage and a very high frequency, which is still not achievable with existing techniques. The invented frequency-divider circuit generates output signals having a frequency half of the frequency of the input (CLK) signal. The divider circuit consists of two identical D-flip-flops connected in a master/slave configuration. The outputs of each D-flip-flop are connected to the inputs of the other D-flip-flop. The first D-flip-flop is controlled by a single input (CLK) signal connecting to the PMOS loading and NMOS switching transistors. In parallel, the complementary input signal (CLKBAR) drives the PMOS loading and the NMOS switch of the second D-flip-flop. The present invention employs common-gate NMOS switches (rather than common-source NMOS switches as in prior arts) so that the DC biasing of the input signals (CLK and CLKBAR) can be optimized simultaneously for both the PMOS loadings and the NMOS. Those familiar with the field will understand that this novel technique helps enable the frequency-divider circuit to work at a minimum supply voltage of $Vt_{(PMOS)}+V_{overdrive}<1.0$ V and to achieve multi-gigahertz frequency operation at the same time. Experimental results show that this new frequency-divider circuit can work at 1-V supply at a frequency up to 5.2 GHz in a standard 0.35-mm CMOS process. Moreover, simulated in a 0.18-mm CMOS process, the proposed divider can operate successfully at a frequency of more than 20 GHz with a 1-V supply. Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims.

BRIEF DESCRIPTION OF THE DRAWINGS

An embodiment of the invention will now be described by way of example and with reference to the accompanying drawings, in which:

FIG. 3 is a functional block diagram of a low-voltage, high frequency divider circuit in accordance with an embodiment of the present invention, and FIG. 4 is a schematic equivalent representation of the low-voltage, high frequency divider circuit of FIG. 3.

DETAILED DESCRIPTION OF PREFERRED EMBODIMENT

Figure 1:
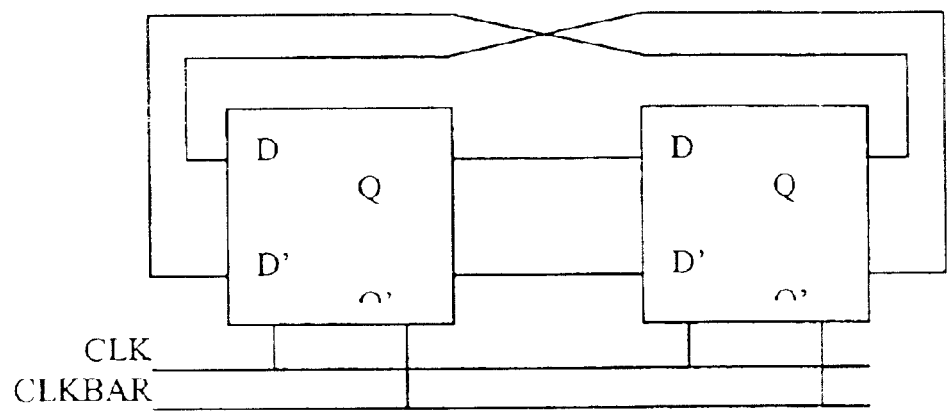
FIG. 1 is a functional block diagram of a circuit according to the prior art.
Figure 2:
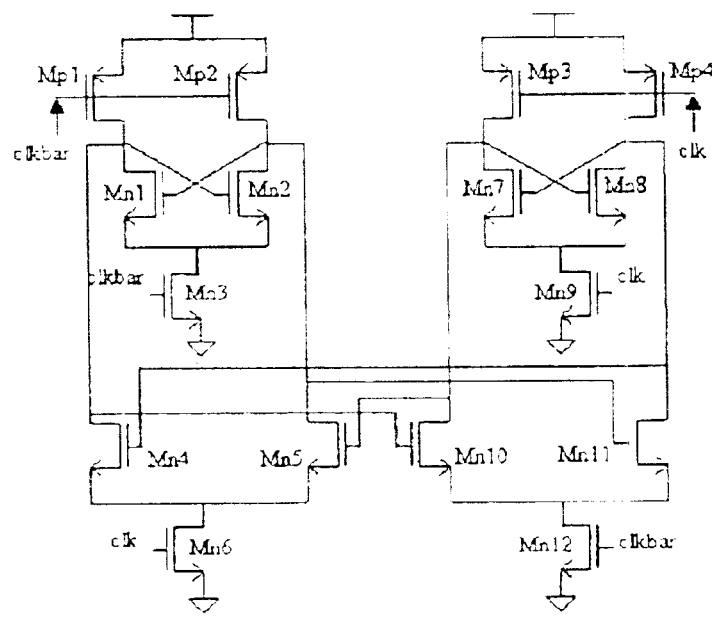
FIG. 2 is a schematic representation of an existing frequency divider circuit of FIG. 1.
Figure 5:
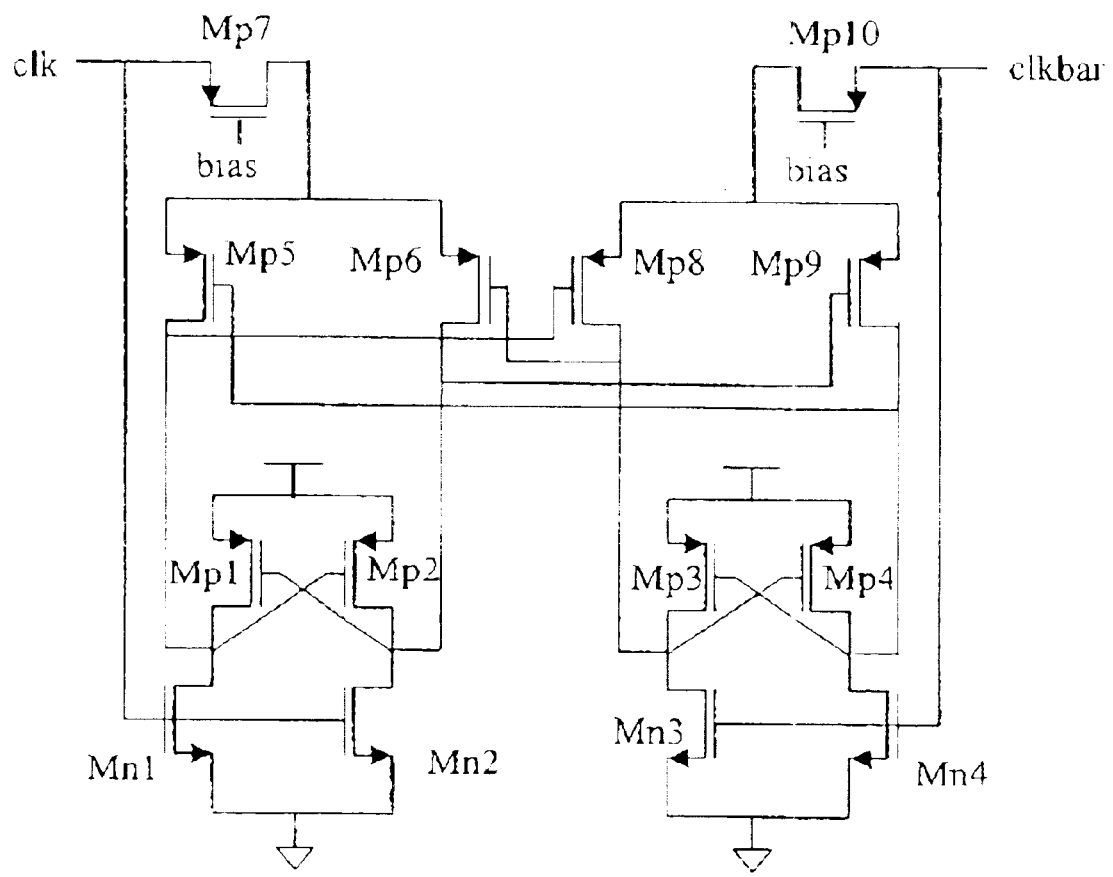
FIG. 5 is a schematic circuit diagram of an alternative embodiment of the low-voltage, high frequency divider circuit of FIG. 3.

FIG. 3 shows the building blocks of an embodiment of the present invention and its schematic is shown in FIG. 4. The proposed frequency divider consists of two identical D-flip-flops cross-coupled with each other. Each circuit section generates an output signal driving the other, in other words the outputs of the first D-flip-flop are connected to the inputs of the second D-flip-flop, and similarly the outputs of the second D-flip-flop are fed back to the first D-flip-flop inputs. Unlike conventional frequency divider designs that employ a pair of complementary input signals within each D-flip-flop section, each of the D-flip-flops in the circuit of FIG. 3 is driven with a single input signal only. In this embodiment of the present invention, the first D-flip-flop is driven by an input signal (CLK), while the second D-flip-flop is driven by an input signal (CLKBAR), which is the complementary counterpart of CLK. The function of the two identical D-flip-flops is in a cooperative relationship. The function of the frequency divider circuit is to receive a CLK signal having a frequency as an input and to produce an output signal equal to substantially half of the CLK frequency.

One D-flip-flop (the left hand side section) includes a pair of PMOS transistors ($Mp_1$, $Mp_2$) which are connected to a DC voltage source $V_{dd}$ and receive the CLK signal as an input at their gate terminals. This pair PMOS transistors is used to realize dynamic loading. As is known in the art, in the sensing mode (when the CLK signal is low), the PMOS transistors turn on. On the other hand, in the latching mode (when the CLK signal is high), the PMOS transistors turn off. The other D-flip-flop also includes a pair of PMOS transistors ($Mp_3$, $Mp_4$) which are also connected to the DC voltage source $V_{dd}$ and receive the CLKBAR signal as an input at their gate terminals.

The drains of NMOS pairs ($Mn_3$, $Mn_4$) and ($Mn_8$, $Mn_9$) are connected at the nodes X, X', Y and Y' respectively. The gates of these two pairs are cross-coupled together. That is, the gates of $Mn_3$ and $Mn_4$ are connected to the nodes Y' and Y, and the gates of $Mn_8$ and $Mn_9$ are connected the nodes X and X'. Another NMOS cross-coupled pair ($Mn_1$, $Mn_2$) and ($Mn_6$, $Mn_7$) are also connected at the nodes X, X', Y and Y' respectively. The gate of $Mn_1$ is connected to the drain of $Mn_2$ and likewise the gate of $Mn_2$ is connected to the drain of $Mn_1$. The same configuration is applied to $Mn_8$, $Mn_9$. As is known in the art, this is a positive feedback structure.

The sources of the NMOS transistors in each pair (Mn3 and Mn4, and Mn8 and Mn9) are connected to respective NMOS transistors $Mn_5$ and $Mn_{10}$ which function as switches. The present invention proposes to connect these NMOS switches ($Mn_5$ and $Mn_{10}$) in a common-gate configuration so that they can now be controlled by their respective input signals (CLK and CLKBAR) applied to their source terminals.

In fact, the employment of the common-gate configured NMOS switches (rather than employing common-source NMOS switches in prior designs) optimizes the DC biasing of the input signals (CLK and CLKBAR) to the circuit. Those who are familiar with the field would understand that the DC biasing of the input signals (CLK and CLKBAR) can be set at 0V. As a result, the minimum supply voltage for the frequency divider of the present invention is given by $V_{ds(PMOS)}+V_{t(PMOS)}$, which is obtained with the consideration of properly biasing of the PMOS transistors ($Mp_1$, $Mp_2$). To achieve low turn-on resistance for the PMOS transistors, an overdrive voltage of about 0.15V is still required. Therefore, taking an example of implementing the new frequency divider in a standard 0.35-mm CMOS process with $V_{t(PMOS)}$=0.8V and $V_{t(NMOS)}$=0.6V, the minimum supply voltage is only equal to 0.95V. This makes it possible for embodiments of the present invention to operate at a lower voltage supply with comparable performances with prior art frequency divider circuits that operate at high supply voltages. As explained previously, the conventional designs require 1.7V for proper operation and fail to operate at a 1-V supply. The minimum operating supply voltage for the invented frequency divider is almost half of the conventional designs needed.

The sensing and latching operation is directly related to the operating frequency of the divider. The sensing and latching mechanism is different from the conventional design in that NMOS pairs ($Mn_3$, $Mn_4$) and ($Mn_8$, $Mn_9$) are used to sense the input in the sensing mode while the NMOS cross-coupled pairs ($Mn_1$, $Mn_2$) and ($Mn_6$, $Mn_7$) are used to latch the output in the latching mode. In the sensing mode, it is desirable to have a smaller RC time constant at the output node to achieve higher frequency. In the conventional design, the CLK signal controls the switch and it complementary signal CLKBAR is required to control the PMOS loading transistor. In the present invention, the CLK signal is used to simultaneously control both the switch $Mn_5$ and the PMOS loading transistor $Mp_1$. When the CLK signal is low, the PMOS loading transistors $Mp_1$ and $Mp_2$ are operated in the linear region, which provides a small RC time constant at the output node and thus a small delay in the change of state at the output node. On the other hand, during the latching mode, a large RC time constant is required to maintain the state at the output node. When the CLK signal is high, the PMOS loading transistors are turned off and the switch $Mn_5$ is turned off. Thus this contributes a large RC time constant at the output node. With the help of NMOS cross-coupled pairs ($Mn_1$, $Mn_2$) that act as a positive feedback, the output node is latched. Such a mechanism greatly increases the maximum operating frequency and the frequency range of the divider.

While there have been shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, although the circuit in FIG. 4 is depicted with certain transistors as PMOS devices and other transistors as NMOS devices, it will be readily understood by those having ordinary skill in the art that the transistor types can be readily interchanged provided that the proper operating voltages are present. It is expressly intended that all combinations of those elements which perform substantially the same function in substantially the same way to achieve the same results are within the scope of the invention. Moreover, it should be recognized that structures and/or elements shown and/or described in connection with any disclosed form or embodiment of the invention may be incorporated in any other disclosed or descried or suggested form or embodiment as a general matter of design choice.

What is claimed is:

1. A frequency divider circuit that generates output signals having a frequency substantially half of the frequency of an input signal, comprising two D-Flip-Flop circuits wherein one employs said input signal and the other one employs the complement of said input signal, and wherein each of the two D-Flip-Flop circuits includes a pair of loading transistors, two regenerative transistor pairs coupled with each other, and two common-gate switches.

2. The circuit of claim 1, wherein said pair of loading transistors comprises p-channel CMOS transistors.

3. The circuit of claim 1, wherein said regenerative transistor pairs comprise four n-channel CMOS transistors.

4. The circuit of claim 1, wherein said switches comprise an n-channel CMOS transistor operated in a common-gate configuration.

5. The circuit of claim 1, wherein said pair of loading transistors comprises n-channel CMOS transistors.

6. The circuit of claim 1, wherein said regenerative transistor pairs comprise four p-channel CMOS transistors.

7. The circuit of claim 1, wherein said switches comprise a p-channel CMOS transistor operated in a common-gate configuration.

* * * * *